(12) United States Patent
Enyama et al.

(10) Patent No.: US 8,552,373 B2
(45) Date of Patent: Oct. 8, 2013

(54) CHARGED PARTICLE BEAM DEVICE AND SAMPLE OBSERVATION METHOD

(75) Inventors: Momoyo Enyama, Kunitachi (JP); Hiroya Ohta, Kokubunji (JP); Taku Ninomiya, Hitachinaka (JP); Mari Nozoe, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 137 days.

(21) Appl. No.: 13/321,583

(22) PCT Filed: May 18, 2010

(86) PCT No.: PCT/JP2010/003342
§ 371 (c)(1),
(2), (4) Date: Nov. 21, 2011

(87) PCT Pub. No.: WO2010/137257
PCT Pub. Date: Dec. 2, 2010

(65) Prior Publication Data
US 2012/0061565 A1    Mar. 15, 2012

(30) Foreign Application Priority Data

May 27, 2009   (JP) .................................. 2009-127698

(51) Int. Cl.
*H01J 37/26*   (2006.01)
*H01J 37/28*   (2006.01)
*G01N 23/22*   (2006.01)
*G01N 23/225*   (2006.01)

(52) U.S. Cl.
USPC ............ 250/310; 250/307; 250/397; 250/399

(58) Field of Classification Search
USPC ............ 250/306, 307, 309, 310, 311, 396 R, 250/397, 399, 492.21, 492.3
See application file for complete search history.

(56) References Cited

U.S. PATENT DOCUMENTS

| 5,892,224 A | 4/1999 | Nakasuji |
| 7,214,951 B2 * | 5/2007 | Stengl et al. ............. 250/492.23 |
| 8,368,030 B2 * | 2/2013 | Platzgummer et al. ... 250/396 R |
| 2005/0104013 A1 * | 5/2005 | Stengl et al. ............. 250/492.21 |
| 2005/0214958 A1 | 9/2005 | Nakasuji et al. |
| 2006/0060781 A1 * | 3/2006 | Watanabe et al. ............. 250/310 |
| 2008/0067376 A1 | 3/2008 | Tanimoto et al. |
| 2008/0230697 A1 | 9/2008 | Tanimoto et al. |
| 2009/0140160 A1 * | 6/2009 | Platzgummer et al. ... 250/396 R |
| 2013/0105690 A1 * | 5/2013 | Katou et al. ................. 250/307 |

FOREIGN PATENT DOCUMENTS

| JP | 10-134757 A | 5/1998 |
| JP | 2005-251440 A | 9/2005 |
| JP | 2007-317467 A | 12/2007 |
| JP | 2008-215969 A | 9/2008 |

* cited by examiner

*Primary Examiner* — Bernard E Souw
(74) *Attorney, Agent, or Firm* — Mattingly & Malur, PC

(57) ABSTRACT

Disclosed is a charged particle beam device, wherein multibeam secondary electron detectors (121a, 121b, 121c) and a single beam detector (140; 640) are provided, and under the control of a system control unit (135), an optical system control circuit (139) controls a lens and a beam selecting diaphragm (141) and switches the electrooptical conditions between those for multibeam mode and those for single beam mode, thereby one charged particle beam device can be operated as a multibeam charged particle device and a single beam charged particle device by switching. Thus, observation conditions are flexibly changed in accordance with an object to be observed, and a sample can be observed with a high accuracy and high efficiency.

20 Claims, 11 Drawing Sheets

CHARGED PARTICLE BEAM DEVICE AND SAMPLE OBSERVATION METHOD

TECHNICAL FIELD

The present invention relates to a charged particle beam device, in particular to highly sensitive and highly efficient inspection and measurement techniques utilizing a charged particle beam.

BACKGROUND ART

In a manufacturing process of a semiconductor device and a magnetic disk, an electron beam length measuring device for measuring a shape and dimensions of a pattern formed on a sample and an electron beam inspection device for inspecting the presence or absence of defects are used. These devices irradiate a charged particle beam (hereinafter referred to as a primary beam) such as an electron beam and an ion beam on the sample and obtain a signal of secondary charged particles (hereinafter referred to as a secondary beam) such as generated secondary electrons. As the charged particle beam device, conventionally, a so-called a scanning electron microscope (SEM) type device, which scans a sample by a primary beam narrowed down to a point, is used. The SEM type device has characteristics that it takes a long time to obtain an image because scanning of the primary beam is performed two-dimensionally to obtain an image, so that it is an object to improve a speed to process a sample, that is, to improve an inspection speed. To achieve the object, a multi-beam type charged particle beam device which uses multiple beams is proposed (see Patent Literatures 1, 2, and 3).

For example, Patent Literature 1 discloses a multi-beam type electron beam inspection device which divides an electron beam emitted from a single electron gun into multiple beams, focuses the multiple beams individually by lenses arranged in an array to form plural beams, and irradiates the plural beams onto a sample and scans the sample by using a single optical element.

The multi-beam type charged particle beam device can obtain information on a sample several times faster than an SEM type device by using plural beams, and the larger the number of the beams is, the faster the inspection speed is. However, in a multi-beam type device, it is difficult to freely change the irradiation condition such as the amount of current irradiated onto a sample, the incident energy, and the size of the field of view when compared with a conventional SEM type device which uses a single beam (hereinafter referred to as a single beam type device). Therefore, the single beam type device may be more effective than the multi-beam type device depending on the sample. For example, in a memory test, an area to be tested is limited to a memory portion in a wafer, so that the advantage of the multi-beam type device, which can irradiate beams onto plural areas at the same time and obtain an image of a large area, cannot be utilized. In this case, to improve the test speed, an irradiation condition in which the amount of current to be irradiated is increased and a deflection width of the beam is decreased should be employed. Therefore, the single beam type device, which can change the irradiation condition more flexibly than the multi-beam type device, is more effective. As described above, if only the multi-beam type device is used, it is not necessarily possible to perform an efficient inspection.

CITATION LIST

Patent Literature

Patent Literature 1: Japanese Patent Application Laid-Open Publication No. 2007-317467

Patent Literature 2: Japanese Patent Application Laid-Open Publication No. 2005-251440

Patent Literature 3: Japanese Patent Application laid-Open Publication No. 2008-215969

SUMMARY OF INVENTION

Technical Problem

In the conventional technique described above, a device which is used as a single beam type device by selecting one signal from formed multiple beams is proposed. For example, Patent Literature 2 proposes a multi-beam type device which can select plural primary beams for inspecting defects and a high resolution single beam for reviewing a defect. For example, Patent Literature 3 proposes a multi-beam type device which has a beam selection aperture for transmitting only a desired beam to the downstream side and selects and transmits one beam. However, in these examples, the formed multiple beams except for one beam are shielded, so that it is difficult to flexibly change the condition such as the amount of current irradiated onto the sample and the size of the field of view, and the advantage of the single beam type device described above cannot be utilized.

The present invention focuses attention on the fact that the single beam type device may be more effective than the multi-beam type device described above, and an object of the present invention is to provide a charged particle beam device and a highly accurate and highly efficient sample observation method, which can utilize characteristics of both the single beam type device and the multi-beam type device.

Solution to Problem

To address the above object, in the present invention, a charged particle beam device, which observes a sample, includes a primary electron optical system for irradiating plural charged particle beams onto a sample, a first detector for detecting a secondary charged particle beam generated from the sample, an observation condition setting unit for setting an observation condition, a switching condition setting unit for setting a switching condition of the number of the plural charged particle beams, a switching control unit for switching the number of the plural charged particle beams on the basis of the switching condition, and a storage unit for storing the observation condition and the switching condition.

Also, the charged particle beam device further includes a beam separator for separating an output direction of the charged particle beam according to an incidence angle of the charged particle beam, and a second detector for detecting a secondary charged particle beam generated from the sample besides the first detector.

Further, in the present invention, to address the above object, a charged particle beam device, which observes a sample, includes a primary electron optical system for irradiating plural charged particle beams onto a sample, a first detector for detecting a secondary charged particle beam generated from the sample, and a control unit for controlling the primary electron optical system, switching the number of plural the charged particle beams, and selecting a multi-beam mode and a single beam mode. The control unit includes an observation condition setting unit for setting an observation condition, a switching condition setting unit for setting a switching condition for switching the number of plural the charged particle beams, and a switching control unit for switching the number of plural the charged particle beams on the basis of the switching condition.

To address the above object, the present invention provides a device in which a switching means for using a multi-beam type charged particle beam device as a single beam type charged particle beam device is added to the multi-beam type charged particle beam device. In a preferred configuration, a single beam detector is disposed in addition to a multi-beam secondary electron detector, and the condition can be flexibly changed by switching electro-optical conditions.

Advantageous Effects of Invention

According to the present invention, it is possible to realize a charged particle beam device having both a high defect detection sensitivity and a high inspection speed.

DESCRIPTION OF EMBODIMENTS

Figure 1:
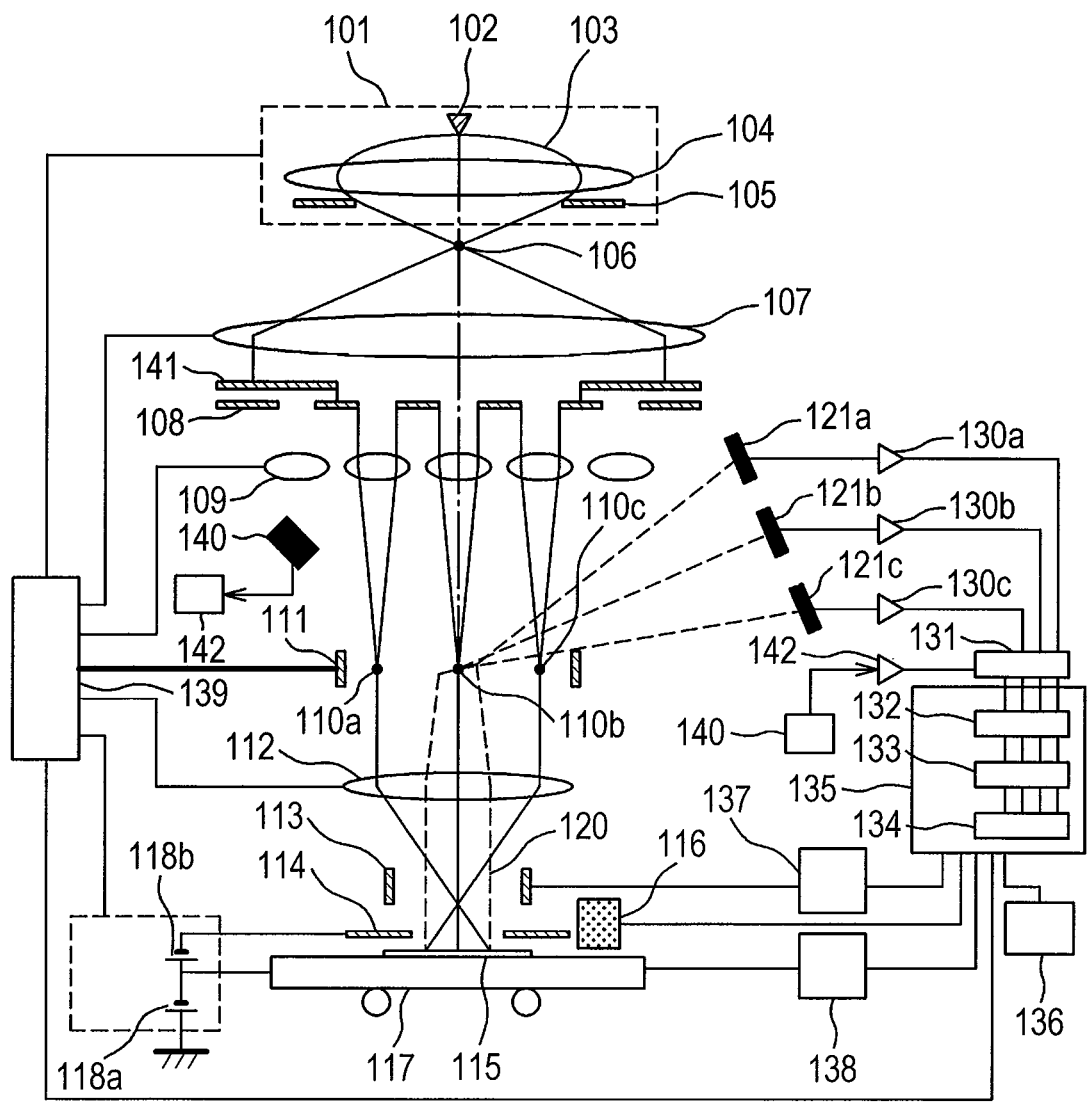
FIG. 1 is a diagram for explaining a schematic configuration in a multi-beam mode of an electron beam inspection device according to a first embodiment.

Hereinafter, various embodiments of the present invention will be described in detail with reference to the drawings. Note that the same elements are denoted by the same reference numerals throughout the drawings for describing the embodiments, and the repetitive description thereof will be omitted. Although embodiments of a sample observation/inspection device which uses an electron beam will be shown below, even when an ion beam is used or the present invention is applied to a measuring device or a usual electron microscope, the effect of the present invention is not lost. Further, in this description, an inspection of a sample includes a meaning of an observation of a sample, and "inspection condition" includes a meaning of "observation condition".

First Embodiment

FIG. 1 is a diagram showing a schematic configuration of an electron beam inspection device according to a first embodiment.

First, a device configuration will be described. An electron gun 101 includes an electron source 102 made of a material with a low work function, an anode 105 having a potential higher than that of the electron source 102, and a magnetic lens 104 that superimposes a magnetic field on an accelerating electric field formed between the electron source and the anode. In the present embodiment, a Schottky cathode is used from which a large current is easily obtained and which stably discharges electrons. In the downstream direction in which a primary electron beam 103 is drawn from the electron gun 101, a lens 107, a beam selecting aperture 141, an aperture array 108 in which plural openings are arranged on the same substrate, a lens array 109 having plural openings, a beam separator 111, an objective lens 112, a scanning deflector 113, a stage 117, multi-beam secondary beam detectors 121a, 121b, and 121c, a single beam secondary beam detector 140, and the like are arranged. Further, a current limiting aperture, a primary beam central axis (optical axis) adjustment aligner, an aberration corrector, and the like are provided to an electron optical system (not shown in FIG. 1). A wafer 115 is placed on the stage 117 and moved with the stage 117.

A negative potential (hereinafter referred to as a retarding potential) is applied to the wafer 115 as described later. Although not shown in FIG. 1, a wafer holder is present between the wafer 115 and the stage 117 in a state in which the wafer holder is electrically connected to the wafer. A retarding power supply 118a is connected to the wafer holder and a desired voltage is applied to the wafer holder and the wafer 115.

A voltage contrast controlling electrode 114 is disposed above the wafer 115 and below the electron gun. A scan signal generation device 137 is connected to the scanning deflector 113, and a voltage contrast controlling power supply 118b is connected to the voltage contrast controlling electrode 114. An optical system control circuit 139 is connected to the electron gun 101, the lens 107, the lens array 109, the beam separator 111, the objective lens 112, the retarding power supply 118a, and the voltage contrast controlling power supply 118b, and further, a system control unit 135 is connected to the optical system control circuit 139. A stage control device 138 is connected to the stage 117. Further, the multi-beam secondary beam detectors 121a, 121b, and 121c, the single beam secondary beam detector 140, and the scanning deflector 113 are also connected to the system control unit 135. As described later, the optical system control circuit 139 functions as a switching control unit that performs switching between multi-beam and single beam on the basis of a set switching condition under control of the system control unit 135.

The system control unit 135 is functionally provided with a storage device 132, a computing unit 133, and a defect determination unit 134, and connected with an input/output unit 136 including an image display device. Although not shown in FIG. 1, needless to say, constituent elements other than a control system and a circuit system are arranged in a vacuum container and operated in a vacuum condition. Also, needless to say, a wafer transport system that moves a wafer from outside of the vacuum container onto the stage is provided. The electron beam inspection device is provided with a voltage contrast controlling mechanism 116 for controlling the sample to have a desired charge potential. The voltage contrast controlling mechanism 116 is connected to the system control unit 135.

More specifically, the system control unit 135 includes a central processing unit (CPU), which is the computing unit 133, and a storage unit, which is the storage device 132. When the CPU executes a program or the like stored in the storage device 132 as the computing unit 133 described above, it is possible to perform control of the function of the defect determination unit 134 or control of the voltage contrast controlling mechanism 116, the scan signal generation device 137, the stage control device 138, the optical system control circuit 139, and the like. In this description, the system control unit, the system control unit and the input/output unit 136, and further the scan signal generation device 137, the stage control device 138, the optical system control circuit 139, the voltage contrast controlling mechanism 116, and the like which are controlled by the system control unit may be collectively referred to as a control unit. Further, the input/output unit 136 may include an input means such as a keyboard and a mouse and a display means such as a liquid crystal display device arranged separately from each other as an input unit and an output unit, or may include an integrated input/output means such as a touch panel.

Next, a wafer pattern inspection in the device of the present embodiment will be described. The present device can be realized as both a multi-beam type device and a single beam type device by setting a switching condition. Therefore, in this description, a condition to use the present device as the multi-beam type device according to a set switching condition is referred to as a multi-beam mode, and a condition to use the present device as the single beam type device according to a set switching condition is referred to as a single beam mode.

First, the multi-beam mode will be described. The primary beam 103 emitted from the electron source 102 is accelerated toward the anode 105 while being focused by the magnetic lens 104 and forms a first source image 106 (point where the beam diameter is minimum). Although not shown in FIG. 1, the electron gun 101 is provided with an aperture and an electron beam within a desired current range passes through the aperture. If the operating conditions of the anode 105 and the magnetic lens 104 are changed, the amount of current of the primary beam passing through the aperture can be adjusted to a desired amount of current. Although not shown in FIG. 1, an aligner that corrects the optical axis of the primary electron beam is disposed between the electron gun 101 and the lens 107, so that if the central axis of the electron beam is shifted from the aperture or the electron optical system, the optical axis can be corrected. The lens 107 straightens the primary beam to a substantially parallel beam using the first source image 106 as a light source.

In the present embodiment, the lens 107 is a magnetic lens. The lens 107 is electrically controlled by the optical system control circuit 139 which receives an instruction from the system control unit 135. The primary beam 103 enters the aperture array 108. The beam selecting aperture 141 is disposed on the upstream side of the aperture array 108. The size and position of the opening of the beam selecting aperture 141 are selected and controlled by the optical system control circuit 139, so that the beam selecting aperture 141 selects beams to be used from the formed multiple beams, lets the selected beams pass through, and shields the other beams. Although, in the present embodiment, one beam selecting aperture 141 is disposed immediately above the aperture array 108, one or more beam selecting apertures 141 may be further disposed on the upstream side or the downstream side of the aperture array 108. The optical system control circuit 139, which receives an instruction from the system control unit 135 and selects and controls plural beams, functions as a switching control unit which switches the number of beams to be irradiated according to the switching condition.

In the multi-beam mode in the present embodiment, the position of the opening of the beam selecting aperture 141 is selected in accordance with three of the five openings of the aperture array 108. The primary beam 103 is divided into three beams by the aperture array and individually focused to be a multi-beam by the lens array 109. Each lens of the lens array 109 includes three electrodes each of which has plural openings, and the lens acts as an einzel lens to the primary beam passing through the openings by applying a voltage to the center electrode of the three electrodes. In the multi-beam mode of the present embodiment, the number of the multiple beams is three. The three beams are individually focused by the lens array 109, and plural second source images 110a, 110b, and 110c are formed.

The primary beam 103 individually focused by the lens array 109 passes through inside the beam separator 111. The beam separator 111 is used to separate the primary beam 103 and the secondary beam 120 from each other. In the present embodiment, a Wien filter, which generates a magnetic field and an electric field perpendicular to each other in a plane substantially perpendicular to the incidence direction of the primary beam and provides a deflection angle to an electron passing through according to the energy of the electron, is employed as the beam separator 111. In the present embodiment, the intensity of the magnetic field and the electric field is set so that the primary beam goes straight ahead, and further, the intensity of the electromagnetic field is adjusted and controlled so that the secondary electron beam entering from the opposite direction is deflected to a desired angle. In the multi-beam mode, as described later, the secondary electron beams reach plural detectors respectively corresponding to the multiple beams separately from each other without being mixed with each other. To achieve the above mechanism, it is necessary to lengthen the paths of the secondary electron beams and position the detectors far away from the sample. At this time, the deflection angle of the beam separator 111 is set to be large so that the paths through which the secondary electron beams pass do not physically interfere with an electron optical system on the upstream side of the beam separator 111, such as the lens array 109. Thereby, the effect of aberration on the primary beam increases. Therefore, to reduce the effect of aberration on the primary beam, the beam separator 111 is positioned at the same height of the second source images 110a, 110b, and 110c of the primary beam. The objective lens 112 is a magnetic lens and projects reduced images of the second source images 110a, 110b, and 110c onto the surface of the wafer 115, which is the sample.

The scanning deflector 113 is arranged in the objective lens 112. When a signal is inputted into the deflector 113 by the scan signal generation device 137, the three beams passing through the deflector 113 receive a deflection action in substantially the same direction by substantially the same angle and raster-scan the surface of the wafer 115, which is the sample.

The retarding potential is applied to the wafer 115 by the retarding power supply 118a, and an electric field decelerating the primary beam is formed. The retarding power supply 118a and the voltage contrast controlling power supply 118b are integrally controlled by the system control unit 135 via the optical system control circuit 139 in the same way as the other optical elements, that is, the electron gun 101, the lens 107, the lens array 109, the beam separator 111, and the objective lens 112. The stage 117 is controlled by the stage control device 138. The system control unit 135 integrally controls the scan signal generation device 137 and the stage control device 138 to inspect a predetermined area of the surface of the wafer 115 by inspecting stripes arranged in a travelling direction of the stage one by one. A calibration is performed in advance. In the inspection device of the present embodiment, the stage is continuously moved when an inspection is performed, and the primary beam is controlled to sequentially scan belt-shaped areas by a combination of the deflection by the scanning and the movement of the stage. The belt-shaped areas are formed by dividing a predetermined inspection area corresponding to the multiple beams, and the entire inspection area is scanned when the multiple beams respectively scan the plural belt-shaped areas. The stripe described above corresponds to a range through which the plural belt-shaped areas corresponding to the multiple beams pass.

The three primary beams that reach the surface of the wafer 115 and the material near the surface interact with each other. Thereby, secondary electrons such as backscattered electrons, secondary electrons, and Auger electrons are generated from the sample and the generated electrons form the secondary beam 120.

The voltage contrast controlling electrode 114 is an electrode for adjusting the electric field intensity near the surface of the wafer 115 and controlling the path of the secondary beam 120. The voltage contrast controlling electrode 114 is arranged to face the wafer 115 and a positive potential, a negative potential, or the same potential is applied to the wafer 115 from the voltage contrast controlling electrode 114 by the voltage contrast controlling power supply 118b. A voltage applied to the voltage contrast controlling electrode 114 by the voltage contrast controlling power supply 118b is adjusted to an appropriate value according to the type of the wafer 115 and an object to be observed and inspected. For example, when the generated secondary beam 120 is desired to be actively returned to the surface of the wafer 115, a negative voltage is applied to the voltage contrast controlling power supply 118b. On the other hand, a positive voltage can be applied to the voltage contrast controlling power supply 118b so that the secondary beam 120 does not return to the surface of the wafer 115.

After passing through the voltage contrast controlling electrode 114, the secondary beam 120 is focused by the objective lens 112, and further the secondary beam is separated from the path of the primary beam by the beam separator 111 having deflection function for the secondary beam. To obtain signals of the multiple beams without being mixed together, the secondary electron beam 120 reach plural multi-beam secondary beam detectors 121a, 121b, and 121c corresponding to the multiple beams in a state in which the secondary electron beam 120 is divided into the multiple beams and the multiple beams are not mixed with each other. The detected signals are amplified by the amplifier circuits 130a, 130b, and 130c, digitalized by the A/D converter 131, and temporarily stored in the storage device 132 in the system control unit 135 as image data. Thereafter, the computing unit 133 calculates various statistics of the image, and finally, the defect determination unit 134 determines the presence or absence of defects on the basis of a defect determination condition obtained in advance. These operations can be realized by a program executed by the CPU described above. The determination result is displayed on the image display device of the input/output unit 136. A pattern inspection can be sequentially performed on an area to be inspected in the wafer 115 from an edge of the area by the procedure described above.

Next, the single beam mode of the present embodiment will be described with reference to FIGS. 2, 3A, 3B, and 3C. The description of the same operations and components as those in the multi-beam mode shown in FIG. 1 will be omitted.

When the device is used in the single beam mode, it is possible to flexibly change the irradiation condition such as the amount of current irradiated onto the sample, the incident energy, and the size of the field of view when compared with the multi-beam mode. The incident energy can be changed by changing the retarding potential determined by the retarding power supply 118a and the size of the field of view can be changed by changing the signal inputted into the deflector 113 by the scan signal generation device 137, so that the descriptions thereof will be omitted. Here, a method for changing the amount of current irradiated onto the sample will be described.

Figure 2:
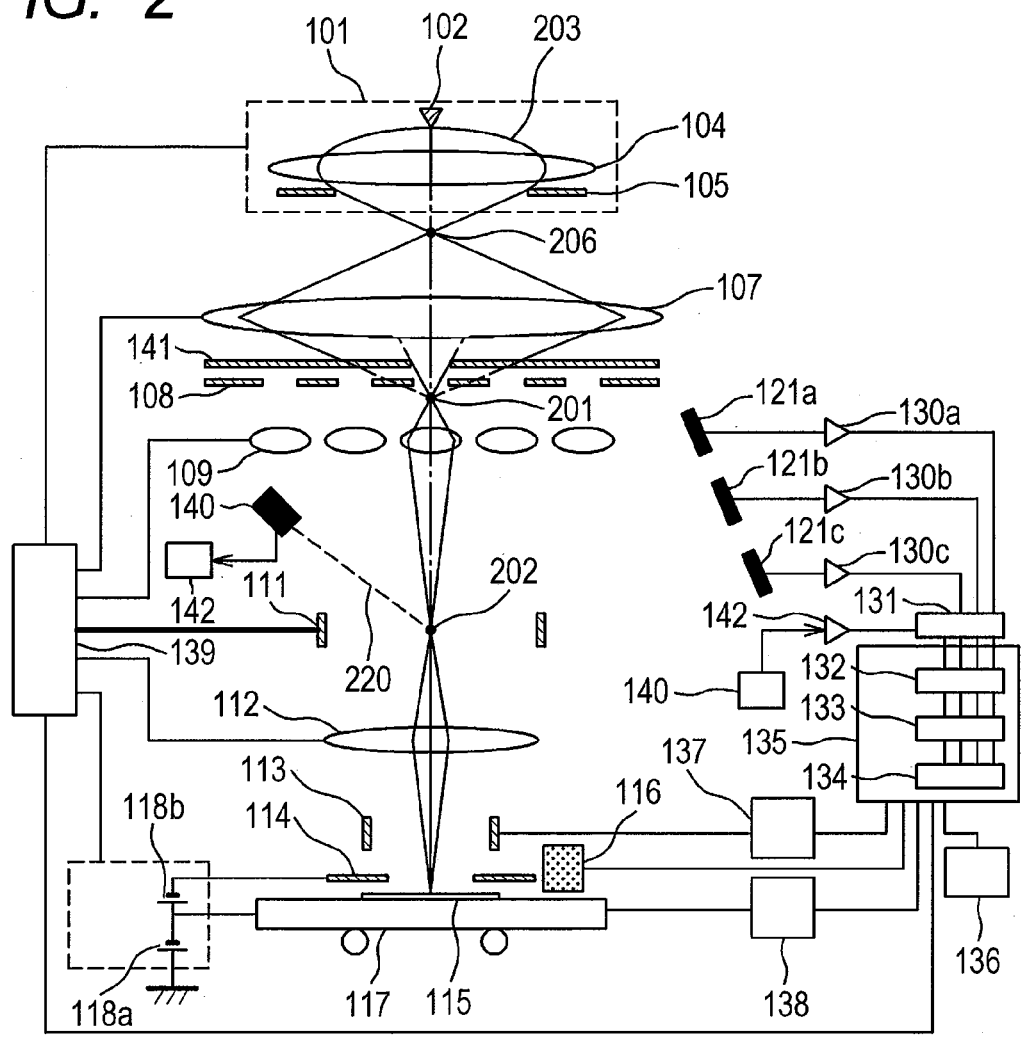
FIG. 2 is a diagram for explaining a schematic configuration in a single beam mode of the electron beam inspection device according to the first embodiment.

FIG. 2 is a schematic diagram when a wafer pattern inspection is performed in the single beam mode by the device configuration of FIG. 1. The operations from when a primary beam 203 is emitted from the electron source 102 to when a first source image 206 is formed are the same as those in the multi-beam mode. The primary beam 203, whose light source is a first source image 206, passes through the beam selecting aperture 141 while being focused by the lens 107 electrically controlled by the optical system control circuit 139. At this time, the beam selecting aperture 141 fits an opening that selects one beam by an instruction from the optical system control circuit 139 which receives an instruction from the system control unit 135 so that the primary beam 203 becomes a single beam. The primary beam 203 forms a second source image 201 and a third source image 202 is formed by the lens array 109. In the single beam mode, by forming the second source image 201, the amount of current passing through the downstream side can be increased compared with the multi-beam mode. The current passing through the downstream side can be changed by the opening size of the beam selecting aperture 141. The optical system control circuit 139, which receives an instruction from the system control unit 135 and controls so that a single beam is selected, functions as a switching control unit which switches the number of beams to be irradiated according to the switching condition.

Figure 3A:
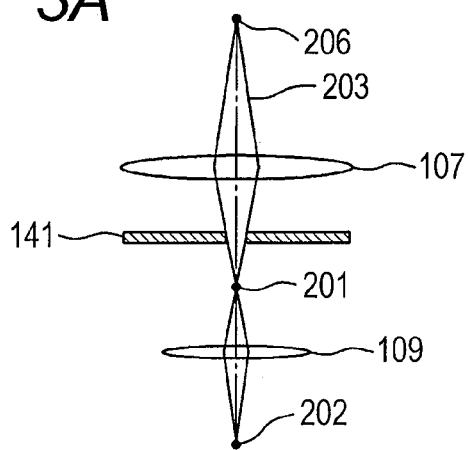
FIG. 3A is an enlarged diagram showing an example of a source image formed in FIG. 2.
Figure 3B:
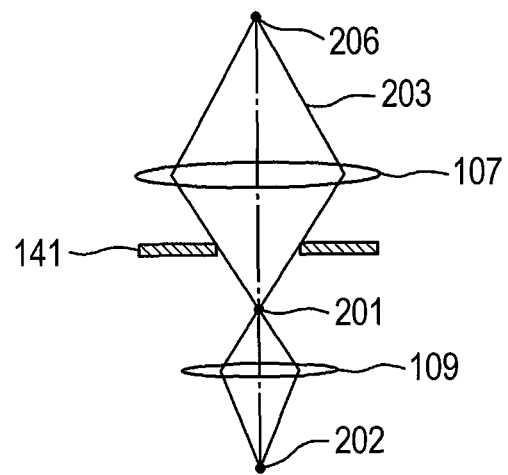
FIG. 3B is an enlarged diagram showing another example of the source image formed in FIG. 2.
Figure 3C:
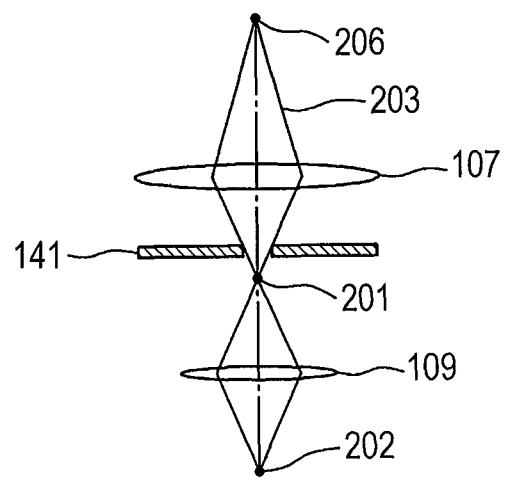
FIG. 3C is an enlarged diagram showing another example of the source image formed in FIG. 2.

The above operations will be described with reference to FIGS. 3A, 3B, and 3C. FIGS. 3A, 3B, and 3C are enlarged diagrams from the first source image 206 to the third source image 202. FIGS. 3B and 3C are diagrams in which the amount of current is increased from that of FIG. 3A. FIG. 3B is an example in which a beam selecting aperture 141 whose opening size is larger than that of the beam selecting aperture 141 in FIG. 3A is selected and the amount of current that can pass through the downstream side is increased. Conditions other than the opening size of the beam selecting aperture 141 are the same between FIGS. 3A and 3B. An appropriate amount of current can be selected by the opening size of the beam selecting aperture. FIG. 3C is an example in which the intensity of the lens 107 is increased and the position of the second source image 201 is moved nearer to the lens 107, so that the amount of current that can pass through the downstream side of the beam selecting aperture 141 is increased. All configurations including the opening size of the beam selecting aperture are the same as those of FIG. 3A, and the only difference is the intensity of the lens 107 that is controlled by the optical system control circuit 139. When compared with FIG. 3B, in the example of FIG. 3C, although the magnification of the entire electron optical system changes when the position of the second source image 201 changes, the amount of current can be freely changed. Therefore, the amount of current of the single beam can be freely selected by appropriately selecting the combination of FIGS. 3B and 3C.

In summary, the amount of current in the single beam mode of the present embodiment is changed by changing the intensity of the beam selecting aperture 141 and the lens 107 by the optical system control circuit 139. In other words, this indicates that the optical system control circuit 139 can perform the switching control between the multi-beam mode and the single beam mode based on an observation condition by an instruction of the system control unit 135.

After the third source image 202 is formed, the primary beam 203 passes through the beam separator 111 and enters the objective lens 112, and then the third source image 202 is reduced and projected onto the surface of the wafer 115 which is the sample. To reduce the effect of aberration on the primary beam, the beam separator 111 is positioned at the same height of the third source image 202 in the same manner as in the multi-beam mode. Here, in the single beam mode, different from the multi-beam mode, the entire secondary electron beam can be obtained by a single detector, so that the detector can be disposed at a position nearer to the sample than the multi-beam detectors. Therefore, in the present embodiment, the single beam secondary beam detector 140 is separately provided in a direction different from the direction of the multi-beam secondary beam detectors 121a, 121b, and 121c and disposed at a position nearer to the sample, so that the single beam secondary beam detector 140 obtains the secondary electron beam in a state in which the deflection angle of the beam separator 111 is small.

It is preferred that the deflection direction toward the beam separator 111 in the single beam mode is switched from the deflection direction in the multi-beam mode to a desired direction. Thereby, in an inspection in the single beam mode, an image with resolution higher than that of an image in the multi-beam mode can be obtained. Specifically, in the inspection in the single beam mode, when an image with the same resolution as that of an image in the multi-beam mode is obtained, a larger current per beam can be used in the single beam mode than in the multi-beam mode, so that the inspection can be quickly performed.

FIGS. 1 and 2 are conceptual diagrams. In FIGS. 1 and 2, the deflection angles and the distances from the sample of the single beam secondary beam detector 140 and the multi-beam secondary beam detectors 121a, 121b, and 121c are drawn to nearly the same angle and distance to avoid positional interference with other objects for the convenience of the drawing. As described above, actually, the distance between the sample and the single beam secondary beam detector 140 is much shorter than the distance between the sample and the multi-beam secondary beam detectors 121a, 121b, and 121c. For example, in the present embodiment, the deflection angle of the single beam secondary beam detector 140 is 3 degrees. On the other hand, the deflection angle of the multi-beam secondary beam detectors 121a, 121b, and 121c is 30 degrees. The distance from the center of a column to the single beam secondary beam detector 140 is several mm to several tens of mm. On the other hand, the distance from the center of the column to the multi-beam secondary beam detectors 121a, 121b, and 121c is several hundreds of mm. The values described above are an example, and the device can be realized in a range of the deflection angle of 30 degrees to 90 degrees in the multi-beam mode and in a range of the deflection angle of 1 degree to 15 degrees in the single beam mode.

Although, in the present embodiment, the detector 140 of the single beam mode is provided separately from the detectors of the multi-beam mode so that an image with high resolution can be obtained, instead of providing such a detector, any one of the multi-beam secondary beam detectors 121a, 121b, and 121c may be used. Or, signals detected by plural detectors may be added together in the system control unit 135 and used. In this case, the deflection angle of the beam separator 111 in the single beam mode is set to the same as that in the multi-beam mode.

In the same manner as in the multi-beam mode, the primary beam 203 receives a deflection action from the deflector 113 and raster-scans the wafer 115 which is the sample while receiving a decelerating action by the retarding potential. The system control unit 135 integrally controls the scan signal generation device 137 and the stage control device 138 to inspect a predetermined area on the wafer 115 by inspecting stripes arranged in a travelling direction of the stage one by one by a program executed by the CPU which is a processing unit. A calibration is performed in advance. The stage is continuously moved when the inspection is performed, and the primary beam is controlled to sequentially scan a belt-shaped area by a combination of the deflection by the scanning and the movement of the stage. In the single beam mode, the belt-shaped area corresponds to a predetermined inspection area, and the entire inspection area is scanned when the primary beam scans the belt-shaped area. In the single beam mode, the stripe described above corresponds to a range passing through the belt-shaped area.

Secondary electrons generated when the primary beam 203 and a material near the surface of the sample interact with each other become a secondary beam 220 and the secondary beam 220 passes through the voltage contrast controlling electrode 114. The secondary beam is focused by the objective lens 112, and further the secondary beam is separated from the path of the primary beam by the beam separator 111 having deflection function for the secondary beam. Then, the secondary beam reaches the single beam secondary beam detector 140. Here, as described above, the single beam secondary beam detector 140 is disposed nearer to the sample than the multi-beam secondary beam detectors 121a, 121b, and 121c. In the single beam mode, the deflection angle of the beam separator 111 is small. A detected signal is amplified by an amplifier circuit 142 and transfers to the A/D converter 131. The signal processing, the determination of the presence or absence of defects, and the display of the determination result after the signal passes through the A/D converter 131 are the same as those in the multi-beam mode. The pattern inspection can be sequentially performed on an area to be inspected in the wafer 115 from an edge of the area by the procedure described above.

Figure 4:
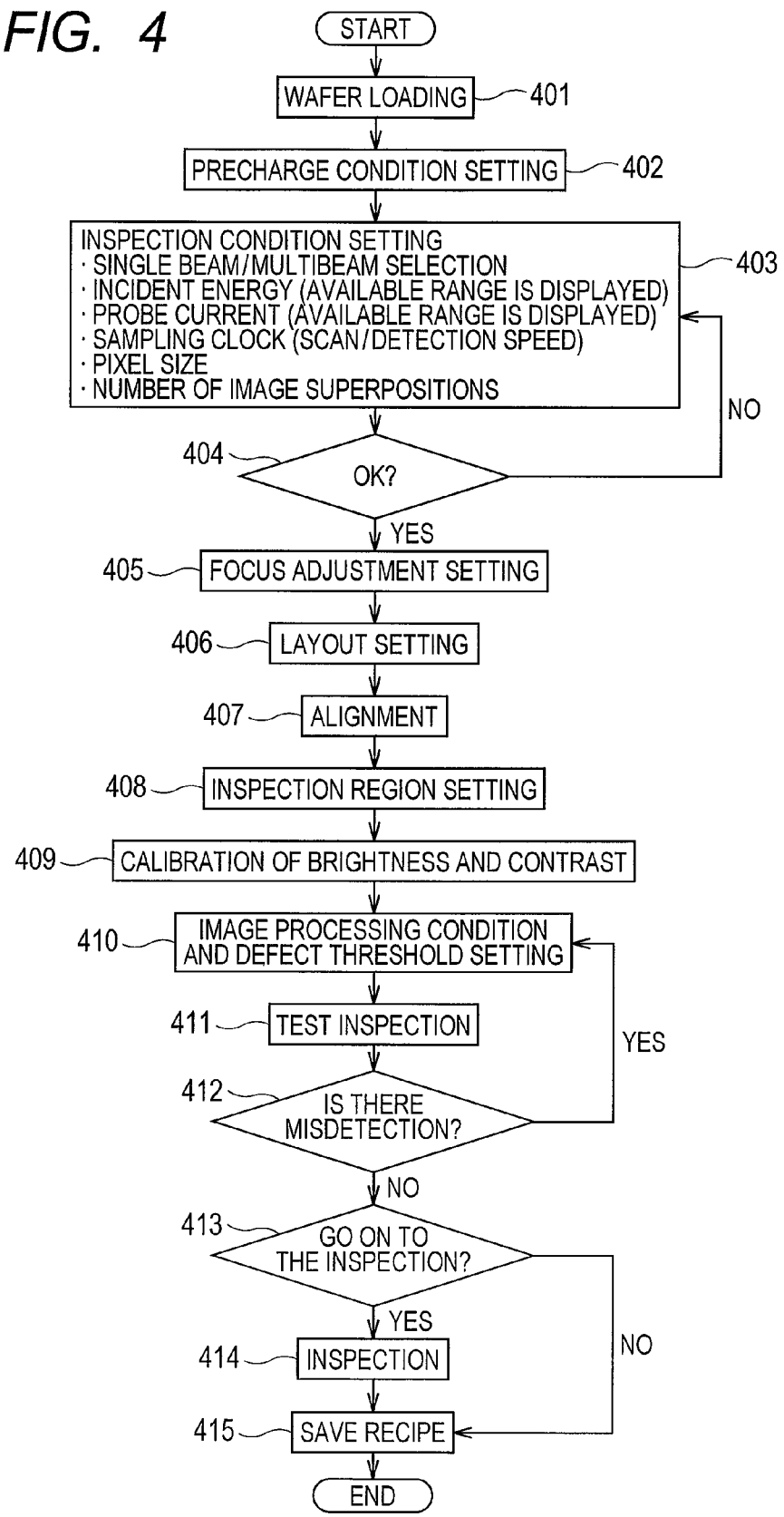
FIG. 4 is a diagram showing a flowchart for performing an inspection according to the first embodiment.

Next, a procedure to perform the observation/inspection by using the device of the present embodiment will be described with reference to FIGS. 4, 5, and 10. FIG. 4 is a flowchart from when a wafer to be inspected is loaded into the device to when the inspection is completed. When making a recipe, an operator determines an optimal condition according to the procedure. The recipe means data such as an electron optical condition necessary to perform an inspection, information of the wafer to be inspected, and an inspection result. The recipe is stored in the storage device 132.

The operator starts the inspection via the input/output unit 136 including an image display device and loads the wafer to be inspected according to an instruction on the image display device (step 401 in FIG. 4). When the loading is completed, an inspection condition setting screen forming an inspection condition setting section shown in FIG. 5 appears on the image display device. FIG. 5 shows a case in which an irradiation condition tab 502 is selected from plural tabs 501 to 509 on the inspection condition setting screen. Hereinafter, FIG. 5 is referred unless otherwise described. First, a precharge tab 501 is selected and a condition to set the wafer to a desired potential is inputted from the input/output unit 136 (step 402 in FIG. 4). The set precharge condition is stored in the storage device 132 to be transferred to the voltage contrast controlling mechanism 116 via the system control unit 135 when the precharge is performed.

Next, the operator selects the irradiation condition tab 502 and sets an inspection condition (step 403 in FIG. 4). Next, the operator selects either a multi-beam mode inspection or a single beam mode inspection in accordance with a condition of the wafer to be inspected from a multi/single beam mode selection box 514 forming a switching condition setting section. When the selection of the multi/single beam mode is completed, an inspection condition input screen 510 is activated and inspection conditions such as incident energy, probe current, voltage contrast controlling electrode voltage, sampling clock (signal acquisition speed per pixel), pixel size, field of view, and the number of image superpositions can be selected. A range that can be set is displayed for each item in accordance with the selection result of the multi/single beam mode, and an appropriate value is selected by clicking an arrow portion on the right side of the screen using the input/output unit 136. When the settings of all the items are completed and an OK button 511 is pressed, a confirmation screen 512 appears. When OK is selected, the setting of the inspection condition is completed (step 404 in FIG. 4). The set inspection condition is stored in the storage device 132 of the system control unit 135. When the inspection is performed, a control signal is transferred from the system control unit 135 to the optical system control circuit 139 and the like on the basis of the stored inspection condition.

After the irradiation condition is determined, the operator selects a focus adjustment tab 503 and sets an amount of focus adjustment (step 405 in FIG. 4). This is a setting for adjusting the focus position by controlling a lens, an aligner, and the like when the focus position is changed due to a change of height of the stage or variation of the amount of charge caused by irradiation of electron beams during inspection. The amount of adjustment for the focus point change is measured, and the focus is adjusted on the basis of the amount of adjustment if the change occurs during inspection. Set various parameters are also stored in the storage device 132, and when the inspection is performed, the stored parameters are transferred from the system control unit 135 to the optical system control circuit 139 and the like as a control signal.

Next, a layout tab 504 is selected and a layout is set according to a pattern arrangement of the wafer to be inspected (step 406 in FIG. 4). The layout is used to manage the coordinates of an inspection chip in the wafer (set by wafer display) and manage the coordinates of cell arrangement in the chip (set by die display). The set layout is reflected on a layout display 513, and also stored in the storage device 132.

Next, alignment is performed (step 407 in FIG. 4). First, an alignment tab 505 is selected and an alignment image for correcting the coordinates of the wafer to be inspected is registered before the inspection. The alignment indicates a process for correcting a slight shift in the arrangement generated when the wafer is mounted on a wafer holder. The alignment image that is registered when the recipe is made is stored in the storage device 132. The device, that is, the CPU in the system control unit 135 automatically measures and corrects the amount of shift between the stored alignment image and an image obtained when the alignment process is performed. The obtained alignment image, coordinates, and the like are stored in the storage device 132 as parameters.

Figure 10:
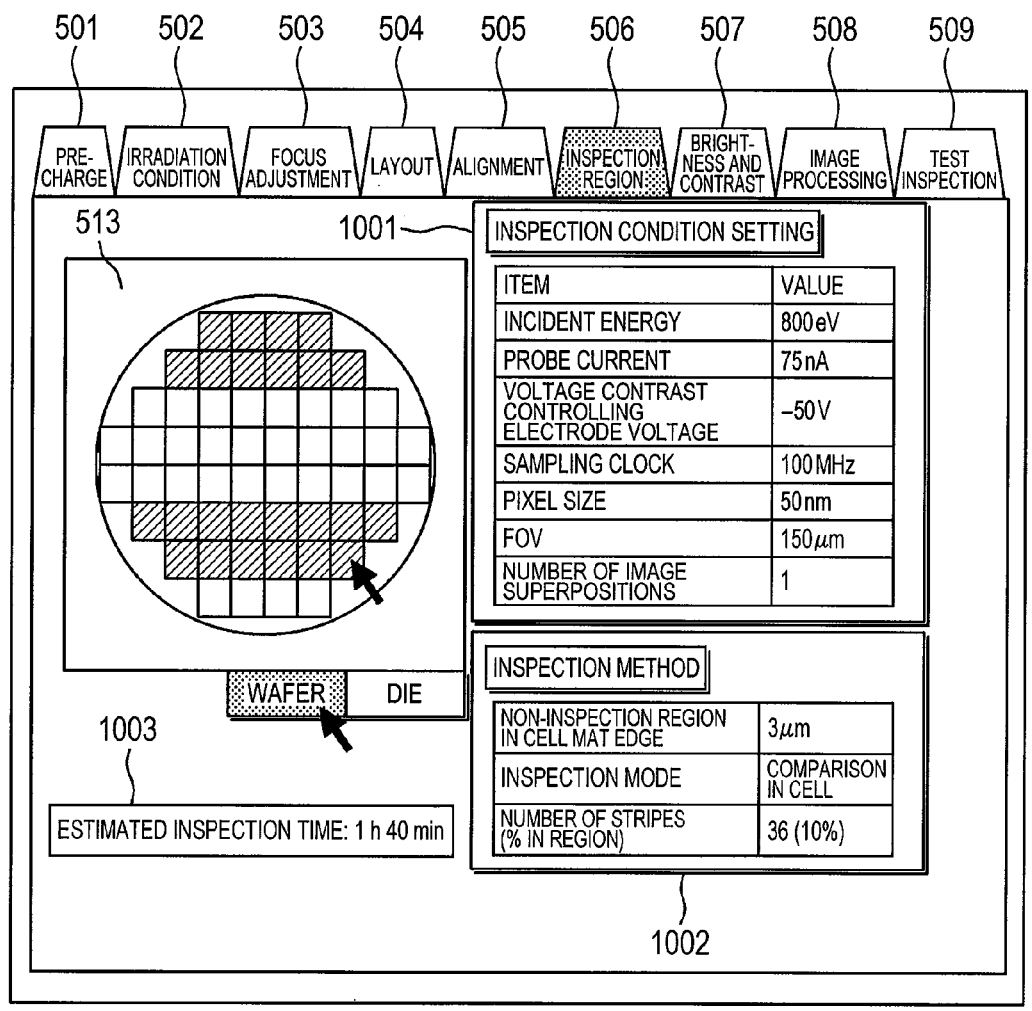
FIG. 10 is a diagram showing an example of an inspection condition setting screen according to the first embodiment.

Next, an inspection region tab 506 is selected to switch the inspection condition setting screen to a screen shown in FIG. 10, and an inspection region is set (step 408 in FIG. 4). When the inspection region is set, an inspection chip and an inspection region in the chip can be specified. Although all the regions of all the chips can be specified, when the inspection condition is desired to be shortened, not all the chips are required to be inspected, or only a specific cell in the chip or a partial area is desired to be inspected, an arbitrary area can be specified. When the layout display 513 in FIG. 10 is the wafer display, a chip to be inspected is clicked and selected from the chip arrangement in the wafer surface, and when the layout display 513 is the die display, a cell to be inspected is selected from the cell arrangement in the chip, so that the inspection region is selected. FIG. 10 shows a case of the wafer display.

An inspection condition 1001 set in step 403 in FIG. 4 is displayed in the inspection condition setting screen in FIG. 10. When an inspection method 1002 is further set, the total inspection time is estimated and the result is displayed in an inspection time estimation result 1003. In the inspection method 1002, a non-inspection region in cell mat edge is set, the inspection mode is set, and the number of stripes is imputed. The operator determines the inspection region while checking the inspection time estimation result 1003. The inputted inspection region data is stored in the storage device 132 as a parameter.

Next, a brightness and contrast tab 507 is selected and a calibration setting of the brightness and contrast is performed (step 409 in FIG. 4). The calibration is to obtain an image and perform gain adjustment and brightness correction according to an amount of signal by distribution of brightness of the image in order to adjust brightness and contrast of an image when the inspection is performed. The coordinates for performing the calibration, the gain and offset value of the brightness, and the like are stored in the storage device 132 as parameters.

When step 401 to the calibration step 409 in FIG. 4 are completed, if an image processing tab 508 is selected, an image can actually be obtained by the various conditions set so far. Here, an image processing condition for detecting defects is set and an image is obtained, and a threshold value for determining that an image is defective is set (step 410 in FIG. 4). At this time, an image acquisition area can be arbitrarily specified. The image acquisition area is a small area in one chip. The small area means, for example, an image area having a length of one chip in a scan width of an electron beam. An image of a portion that is determined to be defective by the inputted threshold value in an acquired image is displayed on the image display device, whether or not a defective image is actually detected and whether or not there is a misdetection are checked, and then, the threshold value is adjusted to an appropriate value. The input of the threshold value, the execution of the image processing, the check of the defect detection and the misdetection state, and the re-input of the threshold value are repeatedly performed, and an optimal inspection condition is determined. The series of the operations (step 411 in FIG. 4) is referred to as a test inspection, and the test inspection is performed by selecting a test inspection tab 509. An image processing calculation is performed by the computing unit 133. The threshold value may be a combination of threshold values of plural items. A defect is determined by the defect determination unit 134. These operations can be performed by execution of a program by the CPU which is the processing unit described above. The various parameters set here are stored in the storage device 132.

If defects are correctly detected in step 410 in FIG. 4 and it is determined that there is no misdetection (step 412 in FIG. 4), extraction of all conditions required for the inspection is completed. The determination in step 412 in FIG. 4 may be performed manually by an operator or may be automatically performed by setting a determination condition in advance.

A screen for selecting whether or not the inspection is continuously performed is displayed on the image display device, so that the operator determines as appropriate (step 413 in FIG. 4). In FIG. 4, if "Yes" is selected in step 413 by using a keyboard, a mouse, or the like, all the conditions set from the start to step 412 are read from the storage device 132, a signal is transmitted from the system control unit 135 to various control units, and the inspection is preformed (step 414 in FIG. 4). The inspection result is stored as a recipe file along with the above conditions (step 415 in FIG. 4) and the inspection is completed. If "No" is selected in step 413, the recipe file is stored without including the inspection result.

Figure 5:
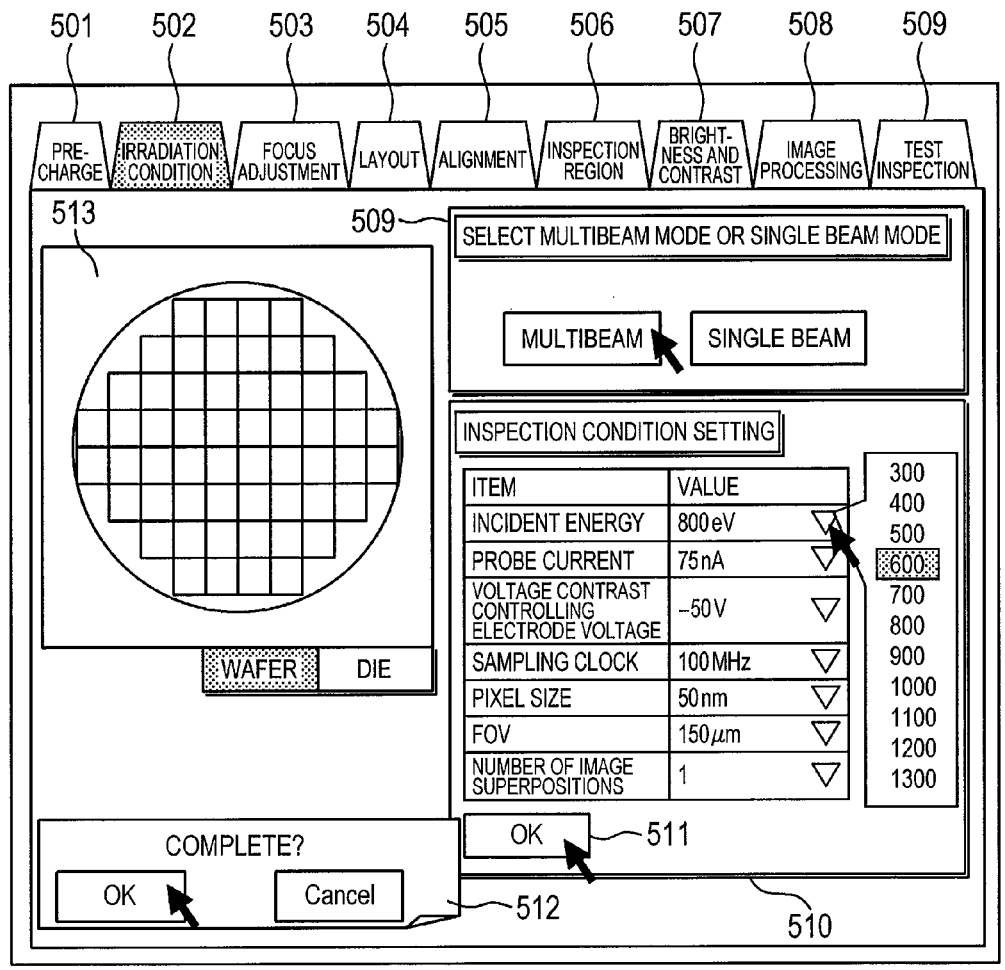
FIG. 5 is a diagram showing an example of an inspection condition setting screen according to the first embodiment.

Needless to say, the inspection condition setting screen forming the inspection condition setting section, an example of which is shown in FIGS. 5 and 10, is not limited to the examples of FIGS. 5 and 10, and various modifications are possible.

Second Embodiment

In the first embodiment, the secondary beam signal of the single beam mode is directly detected by the single beam secondary beam detector 140. Here, to improve the inspection speed, a signal detection speed is also required to be improved, so that it is difficult to increase the detection area of the detector from the viewpoint of response speed of the detector. Therefore, an acquisition amount of the secondary beam varies due to a change of the path of the secondary beam by a scanning deflection and variation of the path of the secondary beam being charged. As a result, the amount of loss of the secondary beam signal varies in the field of view and shading of the image occurs.

Therefore, in the second embodiment, the secondary beam is run into a reflector and generated secondary electrons are detected by a detector in the single beam mode. Thereby, although the S/N ratio degrades due to an increase in shot noise, the shading of the image described above is improved. In the multi-beam mode, the reflector is not used, and the configuration is the same as that of the first embodiment shown in FIG. 1, so that the description of the multi-beam mode will be omitted. The procedure to perform the inspection is the same as that of the first embodiment, so that the description will be omitted.

Figure 6:
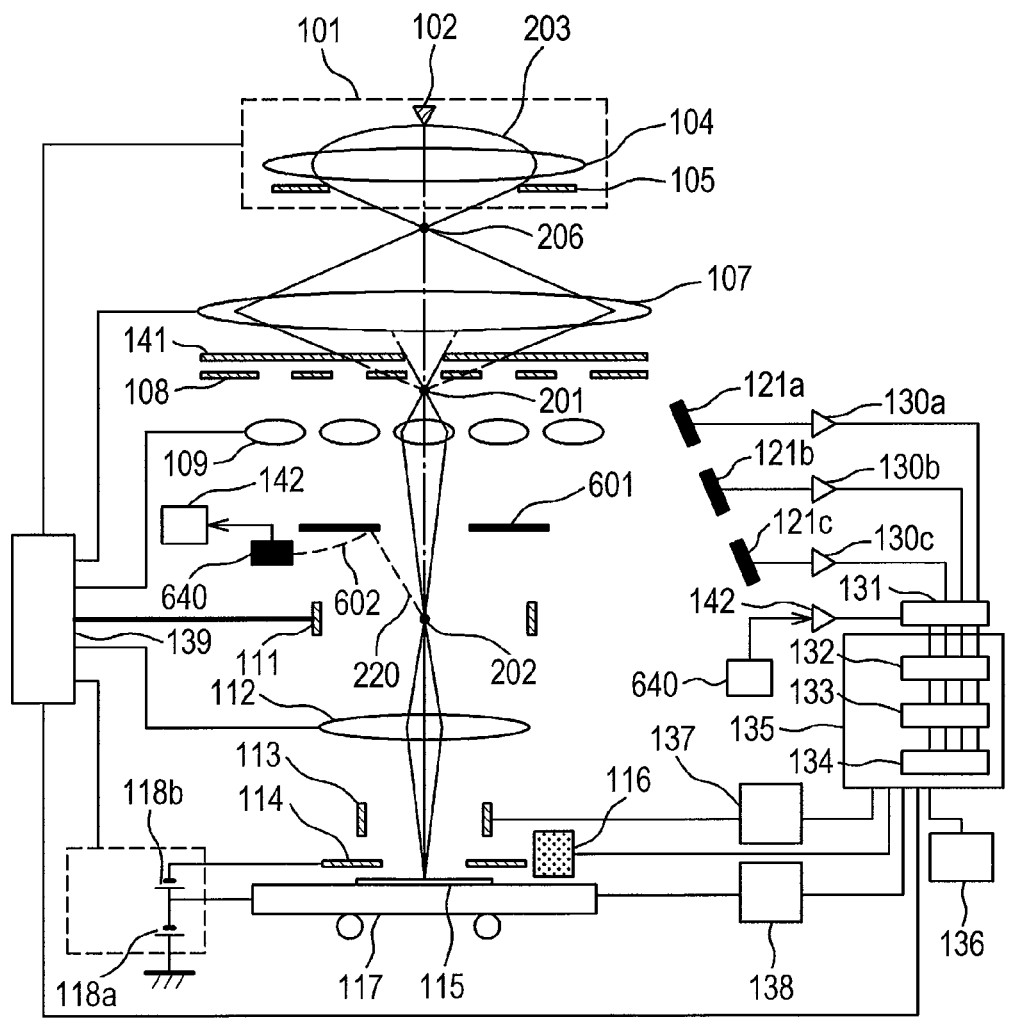
FIG. 6 is a diagram for explaining a schematic configuration in a single beam mode of an electron beam inspection device according to a second embodiment.

FIG. 6 shows a device configuration of the present embodiment and an outline of a case in which a wafer pattern inspection is performed in the single beam mode in this configuration. In the description of the single beam mode below, the same portion as that of the first embodiment will be omitted. The difference from FIG. 1 (or FIG. 2) is only two points. The first point is that a reflector 601 is added and the second point is that the single beam detector is changed to a single beam detector 640 which can receive secondary electrons generated from the reflector 601.

The primary beam 203 is emitted from the electron source 102 and passes through the lens and the like. Then, the primary beam 203 is irradiated onto the surface of the wafer 115 which is the sample, and the secondary beam 220 is generated. The operation so far is the same as that in the first embodiment.

The secondary beam 220 passes through the voltage contrast controlling electrode 114 and receives a focusing action of the objective lens 112. Further the secondary beam is separated from the path of the primary beam by the beam separator 111 having deflection function for the secondary beam, and then the secondary beam hits the reflector 601. The reflector 601 must not to prevent the primary beam from passing through, so that the reflector 601 has an opening. In FIG. 6, for the convenience of the drawing, the horizontal lengths of the arrangements of the aperture array 108 and the lens array 109 are shown to be larger than the opening size of the reflector 601. However, the reflector 601 must not to prevent the primary beam from passing through also in the multi-beam mode, so that, actually, the opening size of the reflector 601 is larger than the horizontal lengths described above, and the opening size is about several mm to several hundreds of mm. In the present embodiment, the opening size is 20 mm, and the deflection angle of the beam separator 111 is 3 degrees, which is the same as that of the first embodiment. The value is an example, and in the same manner as in the first embodiment, it is possible to realize the device in which the deflection angle in the single beam mode is in a range from 1 degree to 15 degrees.

When the secondary beam 220 reaches the reflector 601, secondary electrons 602 are generated. The secondary electrons 602 are detected by a secondary electron detector 640. To reduce the loss of signal, a positive voltage is applied to the secondary electron detector 640, and the secondary electrons 602 are actively attracted to the secondary electron detector 640. In the same manner as in the first embodiment, the detected signal is amplified by the amplifier circuit 142 and transferred to the A/D converter 131, and the system control unit 135 performs the signal processing, the determination of the presence or absence of defects, and the display of the determination result. The pattern inspection can be sequentially performed on an area to be inspected in the wafer 115 from an edge of the area by the procedure described above.

Third Embodiment

In the first and the second embodiments, examples are described in which an operator selects the multi/single beam mode from the switching condition setting section when inputting the irradiation condition in the procedure to perform an inspection. In the present embodiment, a device will be described in which the switching condition setting section automatically determines the selection of the multi/single beam mode by inputting an observation/inspection condition.

The device configuration and an outline of the single beam mode and the multi-beam mode are the same as those of the first embodiment or the second embodiment, so that the description thereof will be omitted here and only the procedure to perform an inspection will be described. In the present embodiment, the procedure is the same as the procedure to perform an inspection described in the first embodiment except that the selection of the multi/single beam mode is automatically performed by the switching condition setting section of the system control unit 135, so that the description of the same procedure will be omitted.

Figure 7A:
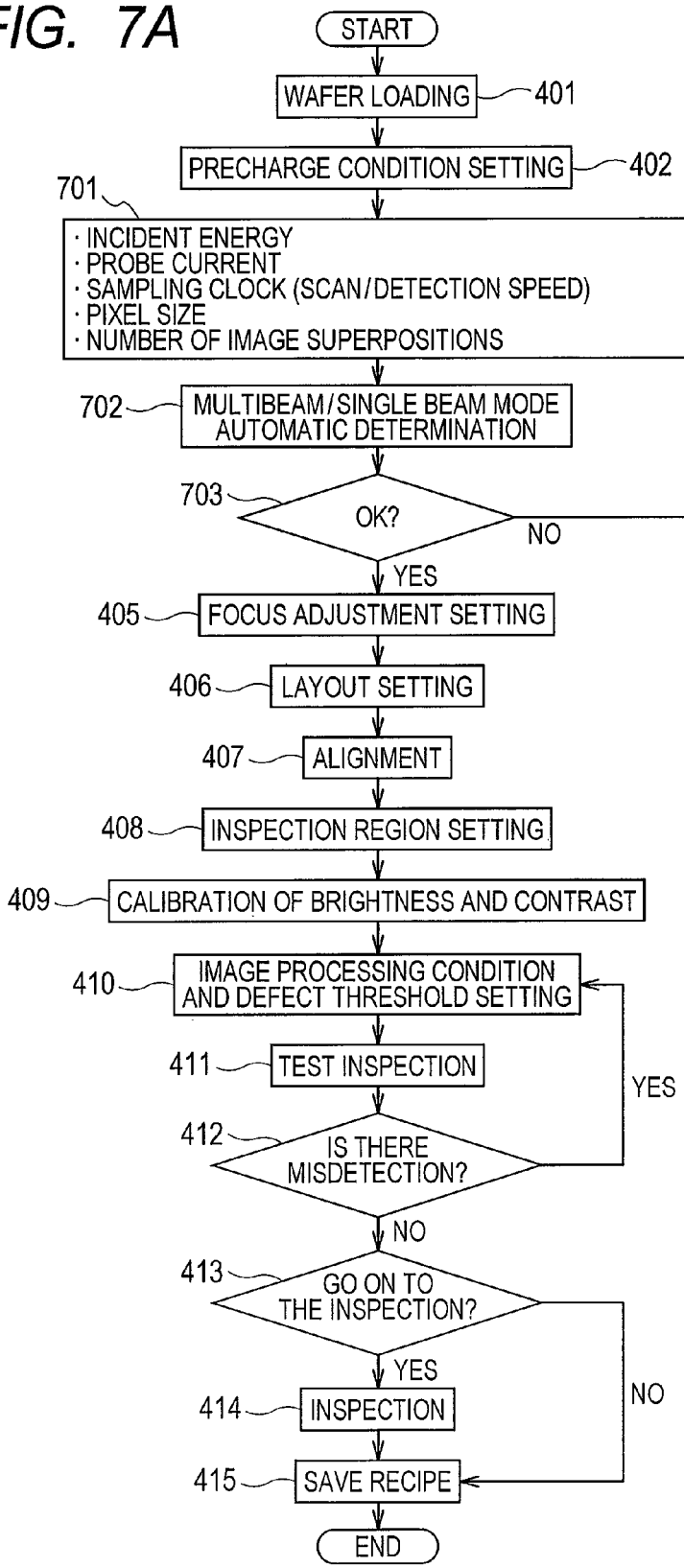
FIG. 7A is a diagram showing a flowchart for performing an inspection according to a third embodiment.

FIG. 7A is a flowchart from when a wafer to be inspected is loaded into the device to when the inspection is completed, and when making a recipe, an optimal condition is determined on the basis of this procedure.

Figure 8:
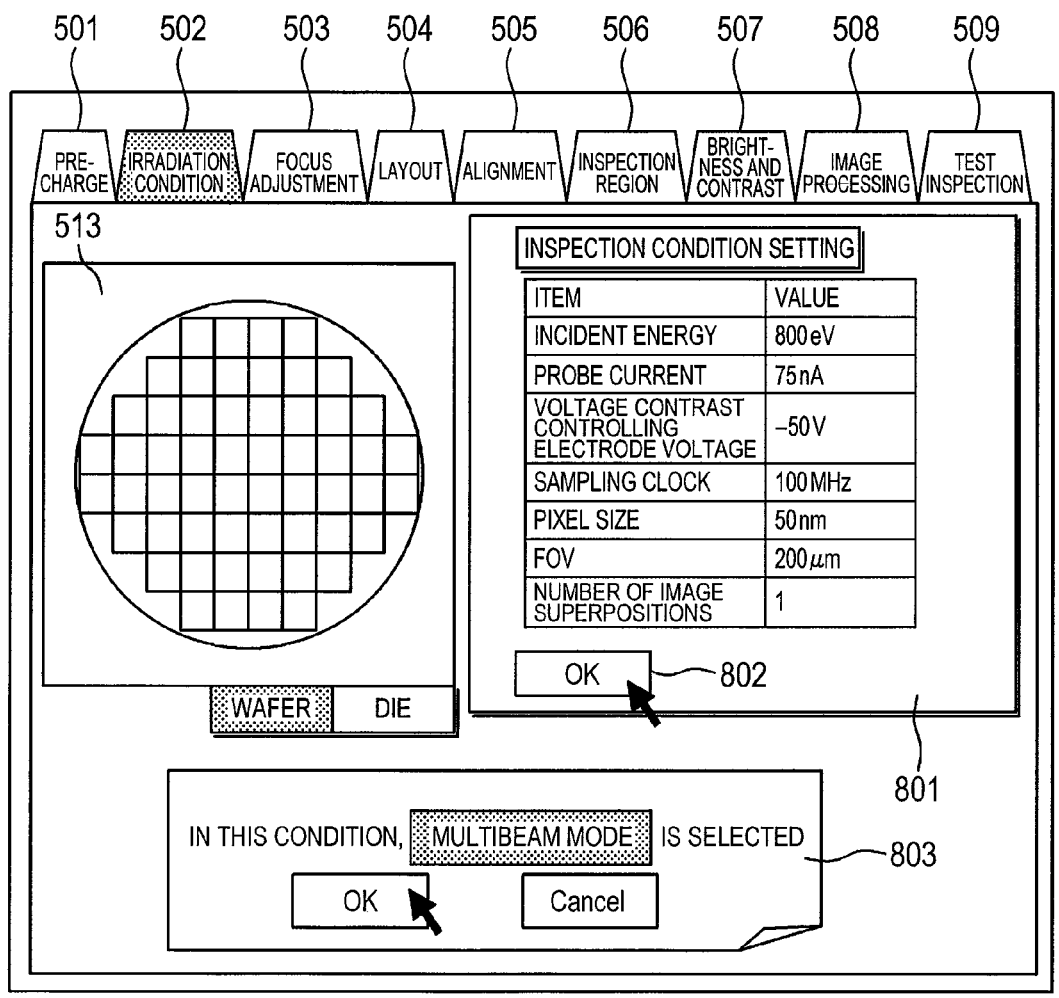
FIG. 8 is a diagram showing an example of an inspection condition setting screen according to the third embodiment.

The operator starts the inspection via the input/output unit 136 including an image display device and loads the wafer to be inspected (step 401 in FIG. 7A). When the loading is completed, an inspection condition setting screen forming an inspection condition setting section shown in FIG. 8 appears on the image display device. FIG. 8 shows a case in which an irradiation condition tab 502 is selected from plural tabs 501 to 509. When an inspection region tab 506 is selected, a screen shown in FIG. 10 appears in the same manner as in the first embodiment. Hereinafter, FIG. 8 is referred unless otherwise described. First, in the same manner as in the first embodiment, a precharge tab 501 is selected and a condition to set the wafer to a desired potential is inputted by a keyboard, a mouse, or the like (step 402 in FIG. 7A).

Next, the operator selects the irradiation condition tab 502 and sets an inspection condition (step 701 in FIG. 7A). The operator sets inspection conditions such as incident energy, probe current, voltage contrast controlling electrode voltage, sampling clock, pixel size, field of view, and the number of image superpositions in an inspection condition input box 801 according to the wafer to be inspected. When an OK button 802 is pressed, a determination screen 803 appears on the image display device and the multi-beam mode or the single beam mode is automatically selected and displayed by the switching condition setting section of the system control unit 135 according to the combination of the conditions inputted by the input/output unit 136 (step 702 in FIG. 7A). When OK is selected, the setting of the inspection condition is completed (step 703 in FIG. 7A). The set conditions are stored in the storage device 132 in the same manner as in the first embodiment. Needless to say, the switching condition setting section can be realized as a program process of the CPU of the system control unit 135.

Figure 7B:
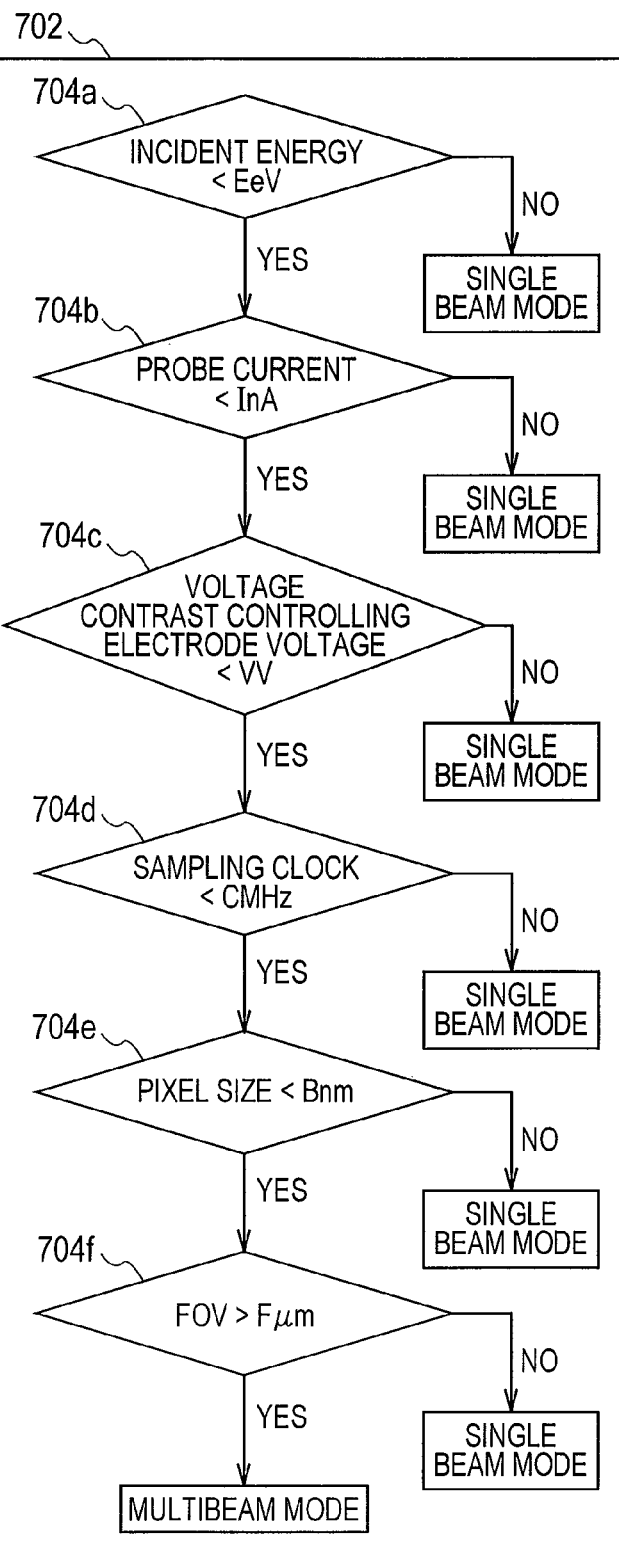
FIG. 7B is a diagram showing details of a multi/single beam mode automatic determination step in FIG. 7A.

Here, a determination method of the multi/single beam mode automatic determination step 702 by the switching condition setting section in the present embodiment will described. FIG. 7B shows details of the multi/single beam mode automatic determination step. Steps 704a to 704f are inspection condition determination steps for determining whether or not the various inspection conditions set in step 701 are compatible with the multi-beam mode. If "Yes" is selected in all the steps 704a to 704f, it is determined to be the multi-beam mode. Otherwise, it is determined to be the single beam mode. This is because, although, in the single beam mode, ranges of the various inspection conditions in step 701 can be large, in the multi-beam mode, the conditions are required to be within certain ranges respectively, and it is possible to select the multi-beam mode only when all the inspection conditions are set within a range that can be used in the multi-beam mode in step 701. For example, in the multi-beam mode, if the incident energy to the sample is largely changed, the position at which the primary beam reaches the sample may shift or the secondary beam becomes difficult to be obtained, so that the incident energy is required to be smaller than E eV. Therefore, in the inspection condition determination step 704a, it is determined whether or not the irradiation energy is smaller than E eV.

In FIG. 7B, in the inspection condition determination steps 704a to 704f, the conditions are sequentially determined. However, a determination by parallel processing may be performed by using a program executed by the CPU in the system control unit 135. Further, a determination may be performed by using a combined result of some conditions such as, for example, a product of the incident energy and the probe current. The various items included in the inspection condition determination steps 704a to 704f are examples, and the determination may be performed by using conditions other than the above.

Next, in the same manner as in the first embodiment, setting of the amount of focus adjustment (step 405 in FIG. 7A), layout setting (step 406 in FIG. 7A), alignment (step 407 in FIG. 7A), inspection region setting (step 408 in FIG. 7A), and calibration of the brightness and contrast (step 409 in FIG. 7A) are performed. All parameters set in these operations are stored in the storage device 132.

In the same manner as in the first embodiment, the operator selects the image processing tab 508, sets an image processing condition for detecting defects, acquires an image, and sets the threshold value for determining that an image is defective (step 410 in FIG. 7A). The image acquisition area is a small area in one chip in the same manner as in the first embodiment. An image of a portion that is determined to be defective by the threshold value inputted from the input/output unit 136 in an acquired image is displayed on the image display device. In the same manner as in the first embodiment, the test inspection tab 509 is selected and the test inspection (step 411 in FIG. 7A) is performed. All of the set various parameters are stored in the storage device 132.

If defects are correctly detected in step 411 in FIG. 7A and it is determined that there is no misdetection (step 412 in FIG. 7A), extraction of all conditions required for the inspection is completed. The determination in step 412 in FIG. 7A may be performed manually by an operator or may be automatically performed by setting a determination condition in advance.

A screen for selecting whether or not the inspection is continuously performed is displayed on the image display device, so that the operator determines as appropriate (step 413 in FIG. 7A). If "Yes" is selected in step 413 in FIG. 7A by using the input/output unit 136, all the conditions set from the start to step 412 in FIG. 7A are read from the storage device, a signal is transmitted to the control unit, and the inspection is preformed (step 414 in FIG. 7A). The inspection result is stored as a recipe file along with the above conditions (step 415 in FIG. 7A) and the inspection is completed. If "No" is selected in step 413 in FIG. 7A, the recipe file is stored without including the inspection result.

Needless to say, the inspection condition setting screen forming the inspection condition setting section, an example of which is shown in FIG. 8, is not limited to the example of FIG. 8, and various modifications are possible.

Fourth Embodiment

In the first to the third embodiments, in the procedure to perform an inspection, one type of the inspection condition is selected to make one recipe, and only one mode of the multi-beam mode and the single beam mode is selected according to the set inspection condition. However, characteristics are different for each cell in a chip in a wafer depending on the type of the wafer to be inspected, so that there is a case in which the multi-beam mode and the single beam mode are desired to be switched to each other in a chip). Therefore, in the present embodiment, an example will be described in which a means capable of selecting a different mode for each cell is included. A basic device configuration and an outline of each mode are the same as those of the first to the third embodiments, so that the description thereof will be omitted and only the procedure to perform an inspection will be described.

In the present embodiment, procedure is the same as the procedure to perform an inspection described in the first to the third embodiments except for an inspection region setting step, and the procedure to perform an inspection is represented by FIG. 4 or FIGS. 7A and 7B. Although the present embodiment will be described with reference to FIGS. 7A and 7B, even when the present embodiment follows the procedure to perform an inspection shown in FIG. 4, the effect of the invention is not lost. Hereinafter, the descriptions of the same portions as those in the first to the third embodiments will be omitted.

A procedure to perform an inspection in the present embodiment will be described with reference to FIGS. 7A, 7B, 8, and 9. Hereinafter, FIG. 8 is referred unless otherwise described.

In the same manner as in the embodiments described above, the operator starts the inspection via the image display device, and when a wafer to be inspected is loaded (step 401 in FIG. 7A), an inspection condition setting screen forming an inspection condition setting section shown in FIG. 8 appears. FIG. 8 is a case in which the irradiation condition tab 502 is selected. In the same manner as in the first to the third embodiments, the precharge tab 501 is selected and a condition to set the wafer to a desired potential is inputted (step 402 in FIG. 7A).

Next, the operator selects the irradiation condition tab 502 and sets a basic inspection condition (step 701 in FIG. 7A). The operator sets inspection conditions such as incident energy, probe current, voltage contrast controlling electrode voltage, sampling clock, pixel size, the number of image superpositions, and the like in an inspection condition input screen 801 according to the wafer to be inspected. When an OK button 802 is pressed, a determination screen 803 appears and the multi-beam mode or the single beam mode is automatically selected by the CPU and the like in the system control unit 135 according to the combination of the inputted conditions (step 702 in FIG. 7A). When OK is selected, the setting of the inspection condition is completed (step 703 in FIG. 7A). The set conditions are stored in the storage device 132 in the same manner as in the first to the third embodiments. The conditions set at this time are the basic inspection condition. A region that is not specified as a separate region in the inspection region setting step is inspected by using the condition set in step 703 in FIG. 7A. The details will be described later.

Next, in the same manner as in the first embodiment, setting of the amount of focus adjustment (step 405 in FIG. 7A), layout setting (step 406 in FIG. 7A), and alignment (step 407 in FIG. 7A) are performed. Parameters set in these operations are stored in the storage device 132.

Figure 9:
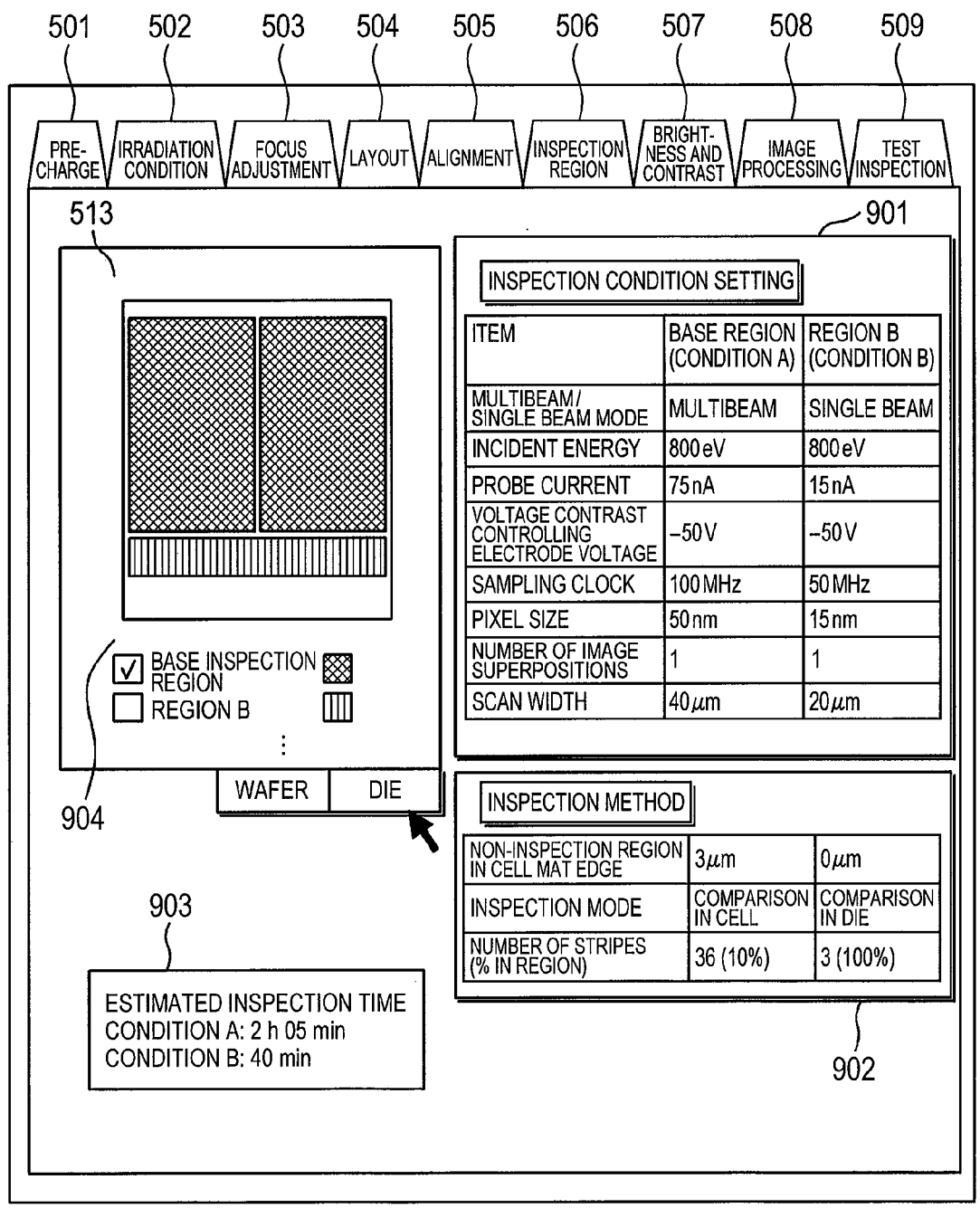
FIG. 9 is a diagram showing an example of an inspection condition setting screen according to a fourth embodiment.

Next, the inspection region tab 506 is selected to switch the inspection condition setting screen to a screen shown in FIG. 9, and an inspection region is set (step 408 in FIG. 7A). When setting the inspection region, in the same manner as in the first to the third embodiments, an inspection chip and an inspection region in the chip can be specified. When the layout display 513 in FIG. 9 is the wafer display, a chip to be inspected is clicked and selected from the chip arrangement in the wafer surface, and when the layout display 513 is the die display, a cell to be inspected is selected from the cell arrangement in the chip, so that the inspection region is selected. In addition to the above, in the present embodiment, it is possible to input different inspection condition for each cell. The die display is selected in the layout display 513 to set inspection condition for each cell. In the inspection condition setting 901 in FIG. 9, the basic inspection condition set in step 701 in FIG. 7A is displayed, and it is possible to add and input plural different inspection conditions to the basic inspection condition. In the present embodiment, "condition B" is added separately from the basic inspection condition.

Plural region setting sections 904 are displayed in a lower part of the layout display 513 in FIG. 9 according to the added inspection condition. A condition for which a region is set is checked, and cells to be set as the condition are clicked, so that inspection region is set for each inspection condition. Further, an inspection method 902 is set in FIG. 9, so that the total inspection time is estimated and the result is displayed in an inspection time estimation result 903. In the inspection method 902, a non-inspection region in cell mat edge is set, the inspection mode is set, and the number of stripes is imputed for each inspection condition. The operator determines the inspection region while checking the inspection time estimation result 903 shown in FIG. 9. The inputted inspection region data is stored in the storage device 132 as a parameter.

When the setting of inspection region is completed, the calibration of the brightness and contrast (step 409 in FIG. 7A) is performed. Parameters set in these operations are stored in the storage device 132.

In the same manner as in the first to third embodiments, the operator selects the image processing tab 508, sets an image processing condition for detecting defects, acquires an image, and sets the threshold value for determining that an image is defective (step 410 in FIG. 7A). The image acquisition area is a small area in one chip in the same manner as in the first to the third embodiments. An image of a portion that is determined to be defective by the inputted threshold value in an acquired image is displayed on the image display device of the input/output unit 136. In the same manner as in the first to the third embodiments, the test inspection tab 509 is selected and the test inspection (step 411 in FIG. 7A) is performed. All of the set various parameters are stored in the storage device 132.

If defects are correctly detected in step 410 in FIG. 7A and it is determined that there is no misdetection (step 411 in FIG. 7A), extraction of all conditions required for the inspection is completed. The determination in step 411 in FIG. 7A may be performed manually by an operator or may be automatically performed by setting a determination condition in advance.

A screen for selecting whether or not the inspection is continuously performed is displayed on the image display device, so that the operator determines as appropriate (step 412 in FIG. 7A). If "Yes" is selected in step 412, all the conditions set from the start to step 411 are read from the storage device, a signal is transmitted to each control unit, and the inspection is preformed (step 413 in FIG. 7A). The inspection result is stored as a recipe file along with the above conditions (step 414 in FIG. 7A) and the inspection is completed. If "No" is selected in step 412 in FIG. 7A, the recipe file is stored without including the inspection result.

Needless to say, the inspection condition setting screen, an example of which is shown in FIG. 9, is not limited to the example of FIG. 9, and various modifications are possible.

Although, in the embodiments described above, an example related to an inspection in which an electron beam is used as a charged particle beam is described, even when an ion beam is used or the present invention is applied to a measuring device or a usual electron microscope, the effect of the present invention is not lost. Although, in the embodiments described above, a wafer is used as an example of a sample to be observed and inspected, even when the sample is a portion cut from a wafer or a structure other than semiconductor, such as a magnetic disk or a biological sample, the effect of the present invention is not lost.

INDUSTRIAL APPLICABILITY

The present invention is useful as a charged particle beam device, in particular useful as highly sensitive and highly efficient observation, inspection, and measurement techniques utilizing a charged particle beam.

REFERENCE SIGNS LIST

101 . . . electron gun, 102 . . . electron source, 103 . . . primary beam, 104 . . . magnetic lens, 105 . . . anode, 106 . . . first source image, 107 . . . lens, 108 . . . aperture array, 109 . . . lens array, 110a . . . first source image, 110b . . . second source image, 110c . . . third source image, 111 . . . beam separator, 112 . . . objective lens, 113 . . . deflector, 114 . . . voltage contrast controlling electrode, 115 . . . wafer, 116 . . . voltage contrast controlling mechanism, 117 . . . stage, 118a . . . retarding power supply, 118b . . . voltage contrast controlling power supply, 120 . . . secondary beam, 121a . . . multi-beam secondary beam detector, 121b . . . multi-beam secondary beam detector, 121c . . . multi-beam secondary beam detector, 130a . . . amplifier circuit, 130b . . . amplifier circuit, 130c . . . amplifier circuit, 131 . . . A/D converter, 132 . . . storage device, 133 . . . computing unit, 134 . . . defect determination unit, 135 . . . system control unit, 136 . . . input/output unit including image display device, 137 . . . scan signal generation device, 138 . . . stage control device, 139 . . . optical system control circuit, 140 . . . single beam secondary beam detector, 141 . . . beam selecting aperture, 142 . . . amplifier circuit, 201 . . . second source image, 202 . . . third source image, 202 . . . primary beam, 206 . . . first source image, 220 . . . secondary beam, 401 . . . wafer loading step, 402 . . . precharge condition extraction step, 403 . . . inspection condition setting step, 404 . . . inspection condition setting completion step, 405 . . . focus adjustment amount setting step, 406 . . . layout setting step, 407 . . . alignment step, 408 . . . inspection region setting step, 409 . . . brightness/contrast calibration step, 410 . . . image processing condition/threshold value setting step, 411 . . . test inspection step, 412 . . . misdetection checking step, 413 . . . inspection continuation checking step, 414 . . . inspection execution step, 415 . . . recipe storing step, 501 . . . precharge tab, 502 . . . irradiation condition tab, 503 . . . focus adjustment tab, 504 . . . layout tab, 505 . . . alignment tab, 506 . . . inspection region tab, 507 . . . brightness and contrast tab, 508 . . . image processing tab, 509 . . . test inspection tab, 510 . . . inspection condition input screen, 511 . . . OK button, 512 . . . confirmation screen, 513 . . . layout display, 514 . . . multi/single beam mode selection box, 601 . . . reflector, 602 . . . secondary electrons, 640 . . . secondary electron detector, 701 . . . inspection condition setting step, 702 . . . multi/single beam mode automatic determination step, 703 . . . inspection condition setting completion step, 704a . . . inspection condition determination step, 704b . . . inspection condition determination step, 704c . . . inspection condition determination step, 704d . . . inspection condition determination step, 704e . . . inspection condition determination step, 704f . . . inspection condition determination step, 801 . . . inspection condition input screen, 802 . . . OK button, 803 . . . determination screen, 901 . . . inspection condition, 902 . . . inspection method, 903 . . . inspection time estimation result, 904 . . . region setting section, 1001 . . . inspection condition, 1002 . . . inspection method, 1003 . . . inspection time estimation result.

The invention claimed is:

1. A charged particle beam device that observes a sample, the device comprising:
a primary electron optical system for irradiating a plurality of charged particle beams onto a sample;
a first detector for detecting a secondary charged particle beam generated from the sample;
an observation condition setting unit for setting an observation condition;
a switching condition setting unit for setting a switching condition of the number of the plurality of charged particle beams;
a switching control unit for switching the number of the plurality of charged particle beams on the basis of the switching condition; and
a storage unit for storing the observation condition and the switching condition.

2. The charged particle beam device according to claim 1, further comprising:
a beam separator for separating an output direction of the charged particle beam according to an incidence angle of the charged particle beam; and
a second detector for detecting a secondary charged particle beam generated from the sample besides the first detector.

3. The charged particle beam device according to claim 2, wherein
the first detector and the second detector are arranged at angles different from each other with respect to a central axis of the primary electron optical system.

4. The charged particle beam device according to claim 2, further comprising:
a reflector that the secondary charged particle beam generated from the sample hits,
wherein the second detector detects a secondary charged particle generated when the secondary charged particle beam hits the reflector.

5. The charged particle beam device according to claim 1, wherein
the switching condition setting unit automatically sets the switching condition according to the observation condition.

6. The charged particle beam device according to claim 1, wherein
the observation condition and the switching condition are set for each small area formed by dividing the sample into a plurality of small areas.

7. A charged particle beam device that observes a sample, the device comprising:
a primary electron optical system for irradiating a plurality of charged particle beams onto a sample;
a first detector for detecting a secondary charged particle beam generated from the sample; and
a control unit for controlling the primary electron optical system, switching the number of a plurality of the charged particle beams, and selecting a multi-beam mode and a single beam mode,
wherein the control unit includes an observation condition setting unit for setting an observation condition, a switching condition setting unit for setting a switching condition for switching the number of a plurality of the charged particle beams, and a switching control unit for switching the number of a plurality of the charged particle beams on the basis of the switching condition.

8. The charged particle beam device according to claim 7, further comprising:
a beam separator for separating an output direction of the charged particle beam according to an incidence angle of the charged particle beam; and
a second detector for detecting the secondary charged particle beam generated from the sample.

9. The charged particle beam device according to claim 8, wherein
the first detector and the second detector are arranged at angles different from each other with respect to a central axis of the primary electron optical system.

10. The charged particle beam device according to claim 8, further comprising:
a reflector for reflecting the secondary charged particle beam generated from the sample,
wherein the second detector detects a secondary charged particle generated when the secondary charged particle beam generated from the sample hits the reflector.

11. The charged particle beam device according to claim 7, wherein the control unit further includes a storage unit for storing the observation condition and the switching condition.

12. The charged particle beam device according to claim 11, wherein
the switching condition setting unit automatically sets the switching condition on the basis of the observation condition set by the observation condition setting unit.

13. The charged particle beam device according to claim 7, wherein
the control unit divides the sample into a plurality of small areas and sets the observation condition and the switching condition for each divided small area.

14. The charged particle beam device according to claim 12, wherein
the control unit divides the sample into a plurality of small areas and sets the observation condition and the switching condition for each divided small area.

15. A sample observation method using a charged particle beam device which includes a primary electron optical system for irradiating a plurality of charged particle beams onto a sample, a detector for detecting a secondary charged particle beam generated from the sample, and a control unit for controlling the primary electron optical system and observes the sample, the sample observation method comprising:
setting an observation condition of the sample; and
setting a switching condition for switching the number of a plurality of the charged particle beams to select a multi-beam mode and a single beam mode,
wherein the control unit controls the primary electron optical system and switches the number of the charged particle beams by the set switching condition, and the control unit observes the sample.

16. The sample observation method according to claim 15, wherein
the control unit automatically sets the switching condition according to the observation condition.

17. The sample observation method according to claim 15, wherein
the control unit further includes an image display device and displays an observation condition setting screen for setting the observation condition.

18. The sample observation method according to claim 15, wherein
the control unit further includes an image display device and displays an observation condition setting screen for setting the observation condition, and
the control unit automatically sets the switching condition on the basis of the observation condition set from the observation condition setting screen.

19. The sample observation method according to claim 18, wherein
the control unit displays the automatically set switching condition on the image display device.

20. The sample observation method according to claim 15, wherein
the control unit divides the sample into a plurality of small areas and sets the observation condition and the switching condition for each divided small area.

* * * * *